(12) United States Patent
Yamanaga et al.

(10) Patent No.: US 7,345,555 B2
(45) Date of Patent: Mar. 18, 2008

(54) WRITING PATTERN STRUCTURE OF DIFFERENTIAL TRANSMISSION PATHS

(75) Inventors: Ko Yamanaga, Sagamihara (JP); Hiroshi Tanaka, Sagamihara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 335 days.

(21) Appl. No.: 11/221,566

(22) Filed: Sep. 8, 2005

(65) Prior Publication Data

US 2006/0066417 A1    Mar. 30, 2006

(30) Foreign Application Priority Data

Sep. 30, 2004  (JP) ............................. 2004-286421
Jun. 17, 2005  (JP) ............................. 2005-177861

(51) Int. Cl.
*H03H 7/38* (2006.01)

(52) U.S. Cl. ..................... 333/32; 361/56; 361/119; 333/12

(58) Field of Classification Search ................ 333/32, 333/33, 248, 238, 1, 12; 361/56, 12, 119
See application file for complete search history.

(56) References Cited

U.S. PATENT DOCUMENTS

2006/0103418 A1*  5/2006  Hargrove et al. ............. 326/21

* cited by examiner

*Primary Examiner*—Stephen E. Jones
(74) *Attorney, Agent, or Firm*—Keating & Bennett, LLP

(57) ABSTRACT

A wiring pattern structure having differential transmission paths electrically connects an integrated circuit element and a connector, which are arranged on a printed wiring board. Each of the differential transmission paths includes a pair of first and second signal lines. The first and second signal lines are substantially hook-shaped and a substantially rectangular area is formed between the first and second signal lines. First and second electrostatic protection elements are disposed in the substantially rectangular area. A bent portion of each of the first and second signal lines may be rounded.

20 Claims, 12 Drawing Sheets

WRITING PATTERN STRUCTURE OF DIFFERENTIAL TRANSMISSION PATHS

BACKGROUND OF THE INVENTION

1. Field of the Invention

The present invention relates to wiring pattern structures of differential transmission paths, and more particularly, to a wiring pattern structure of high-speed differential transmission paths each including a plurality of pairs of signal lines, such as a digital visual interface (DVI), a high definition multimedia interface (HDMI), or the like.

2. Description of the Related Art

Integrated circuit elements used for high-speed differential transmission paths based on DVI, HDMI, or other standards are easily affected by excessive voltages, such as surge voltages, since lower voltages are supplied. Thus, electrostatic protection elements, such as varistors, need to be provided in differential transmission paths to protect integrated circuit elements from surge voltages or the like.

Electrostatic protection elements, such as varistors, have a capacitance. When an electrostatic protection element is provided in a differential transmission path, the characteristic impedance of a portion of the differential transmission path where the electrostatic protection element is provided is lower than the characteristic impedance of other portions of the differential transmission path where the electrostatic protection element is not provided.

Thus, when an electrostatic protection element is provided in a differential transmission path, a technology for achieving a substantially uniform characteristic impedance over the entire differential transmission path is required, as shown in FIG. 11. FIG. 11 is a schematic plan view showing an example of a wiring pattern structure of a differential transmission path for achieving a substantially uniform characteristic impedance. Referring to FIG. 11, a pair of signal lines 111 and 112 is provided on a front surface of a printed wiring board 100 and a ground is provided on a rear surface of the printed wiring board 100. The signal line 111 is provided for a differential signal D+ and the signal line 112 is provided for a differential signal D−. Electrostatic protection elements 200 are provided in the middle of the signal lines 111 and 112.

In the differential transmission path shown in FIG. 11, the distance between the signal lines 111 and 112 in an area A, that is, a portion where the electrostatic protection elements 200 are provided, is larger than the distance between the signal lines 111 and 112 in other portions, that is, portions of the transmission path other than the area A. The line-to-line coupling between the signal lines 111 and 112 in the area A is thus reduced. This increases the characteristic impedance in the area A, and the reduction in the characteristic impedance due to providing the electrostatic protection elements 200 is compensated for by the increase in the characteristic impedance in the area A. Thus, a substantially uniform characteristic impedance can be achieved over the entire pair of signal lines 111 and 112.

For the universal serial bus (USB) standard, only a single differential transmission path including the pair of signal lines 111 and 112 is used. Thus, the purpose can be sufficiently achieved by the technology shown in FIG. 11.

However, for the DVI or HDMI standard, a plurality of high-speed differential transmission paths is required. Thus, a problem explained with reference to FIG. 12 occurs when the technology shown in FIG. 11 is used.

FIG. 12 is a schematic plan view showing an example of a wiring pattern structure of a board having a plurality of differential transmission paths.

Referring to FIG. 12, differential transmission paths 110-1 to 110-4 are provided, and each of the differential-transmission paths 110-1 to 110-4 includes the pair of signal lines 111 and 112.

As shown in FIG. 12, for high-speed differential transmission paths based on the DVI or HDMI standard, four differential transmission paths, that is, the differential transmission paths 110-1 to 110-4, are provided between an integrated circuit element 300 and a connector 310. High-speed differential transmission paths of this type need to send and receive four types of differential signals by achieving synchronization between the integrated circuit element 300 and the connector 310, and the differential transmission paths 110-1 to 110-4 must be arranged to have the same wiring length. However, as shown in FIG. 12, when a plurality of differential transmission paths having the structure shown in FIG. 11 is provided between the integrated circuit element 300 and the connector 310, the lengths of the differential transmission paths 110-1 and 110-4 which are outer differential transmission paths, need to be longer than the lengths of the differential transmission paths 110-2 and 110-3 which are inner differential transmission paths. Thus, it is difficult to set the differential transmission paths to have the same wiring length.

In addition, the signal lines 111 and 112 in portions where the electrostatic protection elements 200 are provided must be separated from each other with a certain distance therebetween so as to accommodate the electrostatic protection elements 200 arranged laterally. Thus, in order to arrange a plurality of differential transmission paths each including the signal lines 111 and 112, a considerably large patterning area is required on the printed wiring board 100.

SUMMARY OF THE INVENTION

In order to solve the above-mentioned problems, preferred embodiments of the present invention provide a wiring pattern structure of differential transmission paths in which a substantially uniform characteristic impedance can be achieved over the entire length of the differential transmission paths and in which the differential transmission paths have the same wiring length and a patterning area is reduced.

According to preferred embodiments of the present invention, a wiring pattern structure of differential transmission paths is provided on a front surface of a board on which first and second electronic components arranged to send and receive differential signals are disposed. Each of the differential transmission paths include a pair of first and second signal lines wherein both ends of each of the first and second signal lines are disposed at positions where corresponding terminals of the first and second electronic components are located so that the first and second electronic components are capable of being electrically connected to each other. A first terminal of a first electrostatic protection element is connected to the first signal line and a first terminal of a second electrostatic protection element is connected to the second signal line. The first and second electrostatic protection elements are disposed in an area between the first and second signal lines. The first and second electrostatic protection elements partially overlap each other when viewed from an alignment direction, that is, from a width direction of the first and second electrostatic protection elements.

With this structure, the size of portions of the first and second electrostatic protection elements that overlap each other when viewed from the alignment direction increases. Thus, the distance between the first and second signal lines of each of the differential transmission paths is reduced. In addition, the differential transmission paths can be close to each other.

The first and second signal lines of each of the differential transmission paths may be substantially parallel to each other and may have substantially the same length. Each of the first and second signal lines of each of the differential transmission paths may include a substantially straight first line element that starts from one end located at the position where the corresponding terminal of the first electronic component is located and that extends toward the second electronic component, a substantially straight second line element that is connected to the first line element and that is tilted at a predetermined angle with respect to the first line element, and a substantially straight third line element that is connected to the second line element and that extends toward the position where the corresponding terminal of the second electronic component is located. The second line element of the first signal line and the second line element of the second signal line may have substantially the same length to form the area of a substantially parallelogram shape between the first and second signal lines, the area being defined by the pair of second line elements functioning as longer sides. The first and second electrostatic protection elements may be disposed in the area. The first terminal of the first electrostatic protection element may be connected to the second line element of the first signal line and the first terminal of the second electrostatic protection element may be connected to the second line element of the second signal line. The first line element of the first signal line of one of the adjacent differential transmission paths may be longer than the first line element of the second signal line of the other one of the adjacent differential transmission paths, and the third line element of the first signal line of the one of the adjacent differential transmission paths may be shorter than the third line element of the second signal line of the other one of the adjacent differential transmission paths. The second line element of the first signal line of the one of the adjacent differential transmission paths may be close and substantially parallel to the second line element of the second signal line of the other one of the adjacent differential transmission paths.

With this unique structure, the second line element of the first signal line of the one of the differential transmission paths is close and substantially parallel to the second line element of the second signal line of the other one of the differential transmission paths. Thus, substantially parallelogram-shaped areas of adjacent differential transmission paths can be close to each other. In addition, the first and second signal lines of the respective differential transmission paths can have substantially the same length. In addition, since the first and second electrostatic protection elements are disposed in the substantially parallelogram-shaped area, by shifting the first and second electrostatic protection elements in the width direction of the first and second electrostatic protection elements, the distance between the second line element of the first signal line and the second line element of the second signal line can be reduced. The width direction is the dimension of the electrostatic protection element that is substantially perpendicular to a line passing through the first and second terminals of the electrostatic protection element. Accordingly, the opposite sides of the electrostatic protection elements not having the first and second terminals partially overlap each other.

A distance between the second line element of the first signal line and the second line element of the second signal line of each of the differential transmission paths may be larger than a distance between the first line element of the first signal line and the first line element of the second signal line of each of the differential transmission paths and larger than a distance between the third line element of the first signal line and the third line element of the second signal line of each of the differential transmission paths in order to reduce line-to-line coupling. Thus, each of the differential transmission paths can exhibit a substantially uniform characteristic impedance over the entire length of each of the differential transmission paths. Line widths of portions of the first and second signal lines of each of the differential transmission paths that define the area of the substantially parallelogram shape may be smaller than line widths of other portions of the first and second signal lines in order to increase an inductance of the portions of the first and second signal lines that define the area. Thus, each of the differential transmission paths can exhibit a substantially uniform characteristic impedance over the entire length of each of the differential transmission paths.

The second electrostatic protection element may be connected to a point in the second line element of the second signal line such that a line length from a connection point of the first electrostatic protection element to the one end of the first signal line is substantially equal to a line length from a connection point of the second electrostatic protection element to the one end of the second signal line.

The area of the substantially parallelogram shape defined by the second line elements of the first and second signal lines functioning as the longer sides may be substantially rectangular shaped.

A joint portion between the first line element and the second line element and a joint portion between the second line element and the third line element of each of the first and second signal lines may be rounded.

With this structure, reflection of differential signals in the joint portion between the first and second signal lines and the joint portion between the second and third line elements of each of the first and second signal lines can be reduced.

The first terminal of each of the first and second electrostatic protection elements may be connected to the second line elements of the first and second signal lines such that lines passing through the first terminals and the second terminals of the first and second electrostatic protection elements are substantially perpendicular to the second line elements of the first and second signal lines. The second terminals may be connected to through holes that are arranged to penetrate portions of the board at which the second terminals are located and that are connected to a ground provided on a rear surface of the board.

With this unique structure, compared with a case where the first and second electrostatic protection elements are obliquely connected to the second line elements of the first and second signal lines, the positions of the through holes are most distant from the second line elements.

The first and second electrostatic protection elements may preferably be varistors, for example.

The differential transmission paths may be high-speed differential transmission paths based on the DVI standard or the HDMI standard. The first electronic component may be an integrated circuit element having at least one of a transmission function and a reception function for the differential signals. The second electronic component may be a connector.

As described above, according to the foregoing wiring pattern structure of the differential transmission paths, the distance between a first signal line and a second signal line of each of the differential transmission paths is reduced and the differential transmission paths can be close to each other. Thus, a patterning area for a plurality of differential transmission paths can be reduced.

In addition, since substantially parallelogram-shaped areas of adjacent differential transmission paths can be close to each other and first and second electrostatic protection elements are disposed in the substantially parallelogram-shaped areas, by shifting the positions of the first and second electrostatic protection elements in the width direction of the first and second electrostatic protection elements, the distance between the second line element of the first signal line and the second line element of the second signal line can be reduced. Thus, a patterning area for a plurality of differential transmission paths can be reduced. In addition, since the first and second signal lines of the respective differential transmission paths have substantially the same length, when a plurality of differential transmission paths is formed wiring with the same length can be achieved over the entire length of the respective differential transmission paths.

In particular, by adjusting the distance between the second line elements of the first and second signal lines or by adjusting the line widths of the portions defining the substantially parallelogram-shaped area, a substantially uniform characteristic impedance can be achieved over the entire length of the respective differential transmission paths. Thus, a wiring pattern with excellent transmission characteristics with little reflection of differential signals can be provided. In addition, since the joint portion between the first and second line elements and the joint portion between the second and third line elements of each of the first and second signal lines are rounded, reflection of differential signals is reduced. Thus, a wiring pattern with further improved transmission characteristics can be provided.

In addition, since the positions of the through holes can be most distant from the second line elements of the first and second signal lines, an influence on the second line elements due to variations in the through holes is prevented. Thus, optimal line characteristics can be maintained.

Other features, elements, characteristics, and advantages of the present invention will become more apparent from the following description of preferred embodiments of the present invention with reference to the attached drawings.

DETAILED DESCRIPTION OF PREFERRED EMBODIMENTS

Preferred embodiments of the present invention will be described with reference to the drawings.

First Preferred Embodiment

Figure 1:
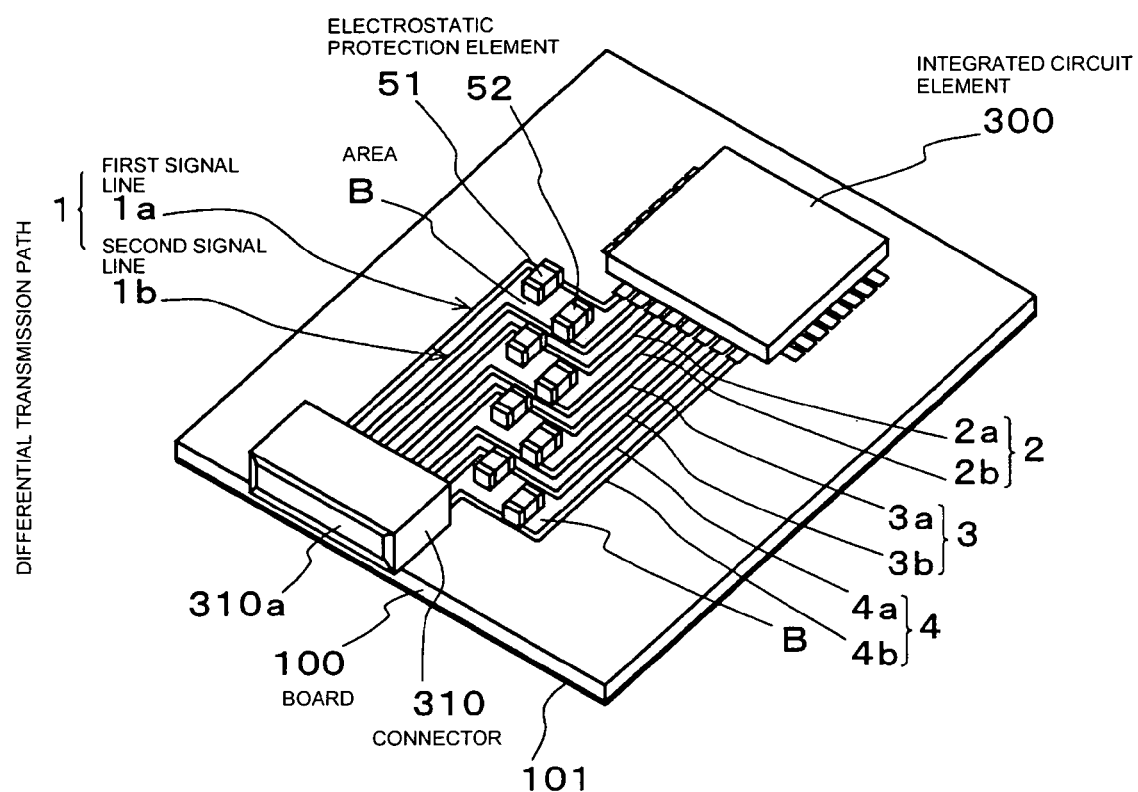
FIG. 1 is a perspective view of a board to which a wiring pattern structure of differential transmission paths according to a first preferred embodiment of the present invention is applied.
Figure 2:
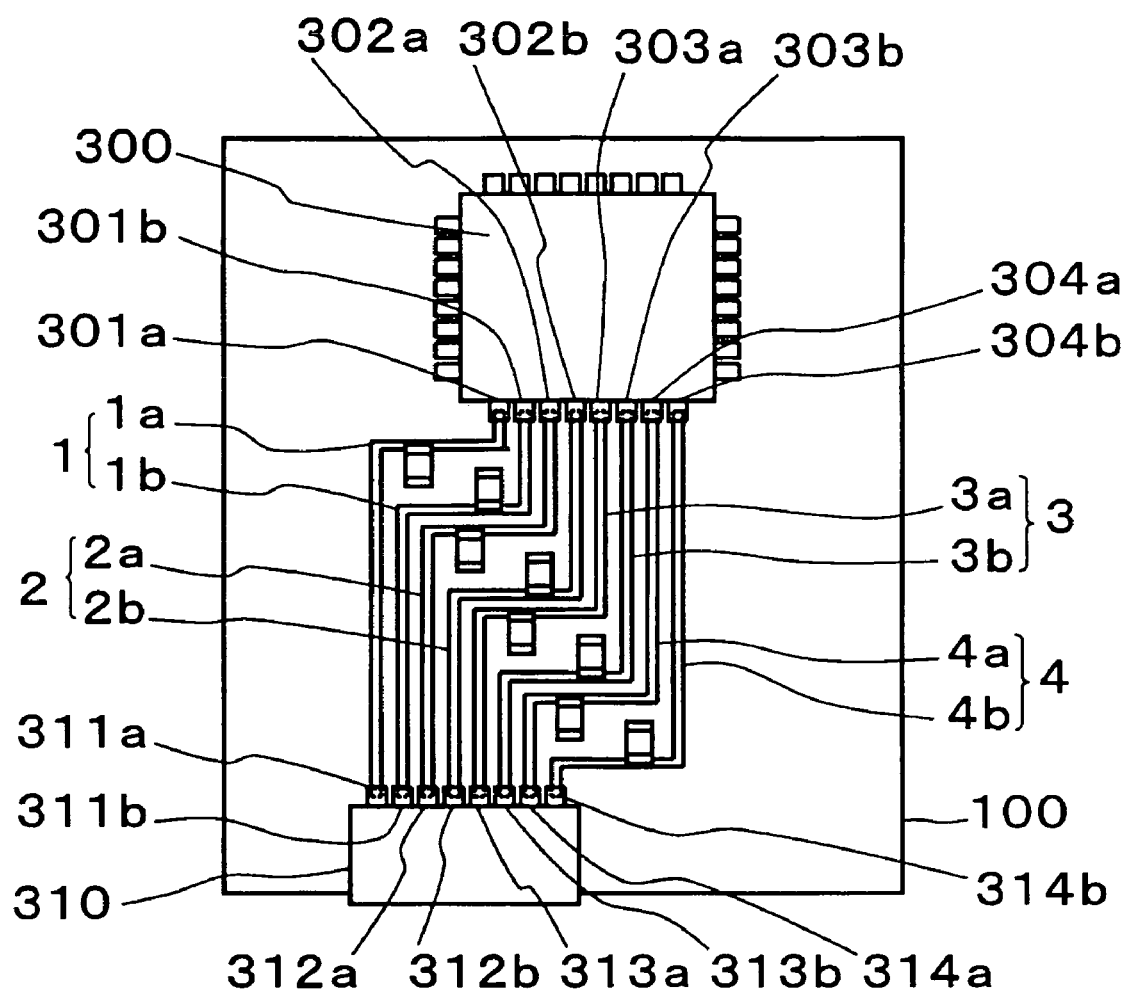
FIG. 2 is a plan view of the board shown in FIG. 1.
Figure 3:
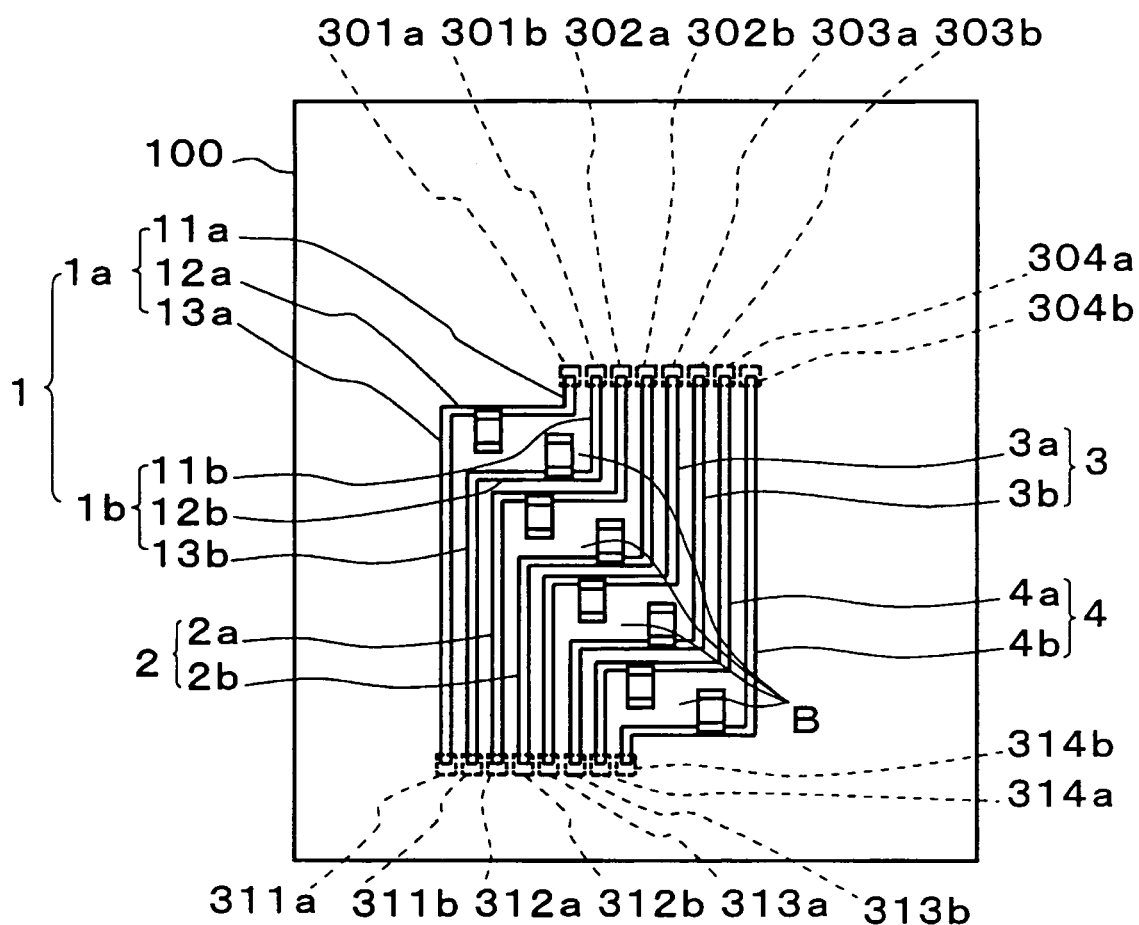
FIG. 3 is a plan view showing the wiring pattern structure of the differential transmission paths according to the first preferred embodiment of the present invention.
Figure 11:
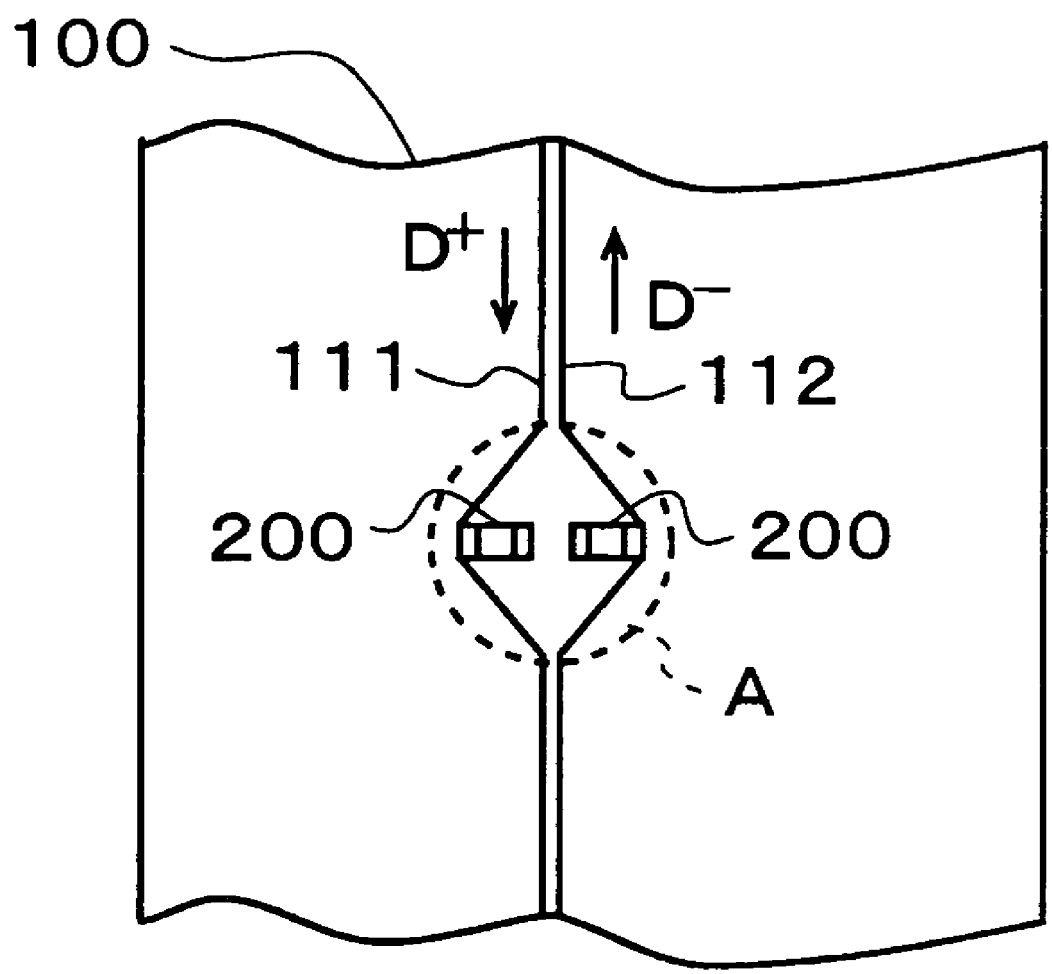
FIG. 11 is a schematic plan view showing an example of a wiring pattern structure of a differential transmission path capable of achieving a substantially uniform characteristic impedance.
Figure 12:
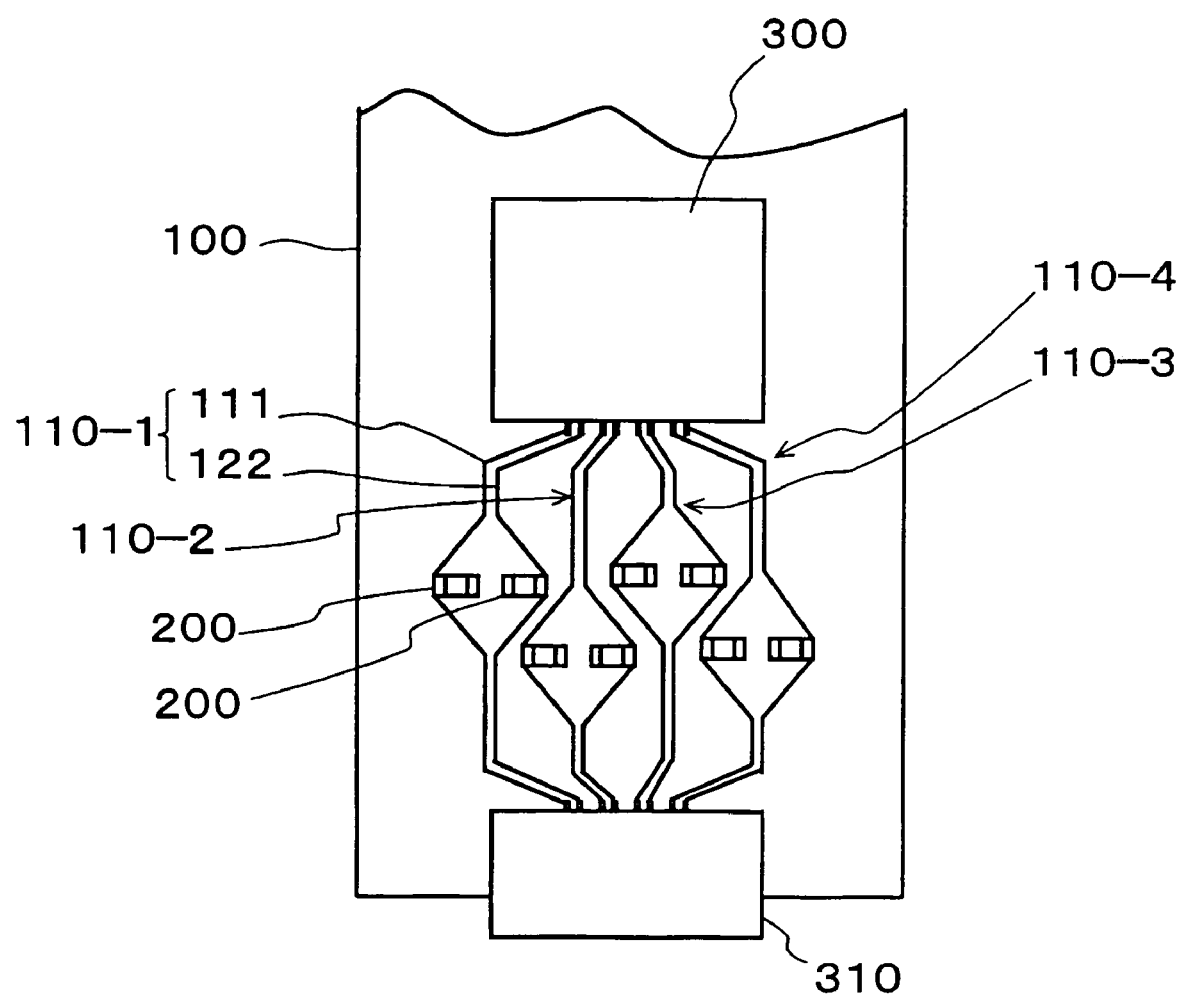
FIG. 12 is a schematic plan view showing an example of a wiring pattern structure of a board having a plurality of differential transmission paths.

FIG. 1 is a perspective view of a board to which a wiring pattern structure of differential transmission paths according to a first preferred embodiment of the present invention is applied. FIG. 2 is a plan view of the board shown in FIG. 1. FIG. 3 is a plan view showing a wiring pattern structure of the differential transmission paths according to the first preferred embodiment. The same portions as in FIGS. 11 and 12 are referred to with the same reference numerals.

The differential transmission paths used in the first preferred embodiment are preferably high-speed differential transmission paths based on the HDMI standard. As shown in FIG. 1, four differential transmission paths, that is, differential transmission paths 1 to 4 are preferably provided. The differential transmission paths 1 to 4 are capable of electrically connecting an integrated circuit element 300 functioning as a first electronic component and a connector 310 functioning as a second electronic component that are installed on a front surface of a printed wiring board 100.

The integrated circuit element 300 sends or receives differential signals to or from the connector 310 via the differential transmission paths 1 to 4. When the printed wiring board 100 is installed in a monitor, the integrated circuit element 300 serves as a receiver having a reception function. When the printed wiring board 100 is installed in a personal computer, an audio-visual device for digital versatile disks (DVDs) or the like, or a household electric appliance, the integrated circuit element 300 serves as a transmitter having a transmission function.

The connector 310 is a component for connecting an HDMI cable (not shown) and includes a cable loading slot 310a. The connector 310 is installed on an edge of the printed wiring board 100 such that the cable loading slot 310a faces the outside. In other words, when the printed wiring board 100 including the integrated circuit element 300 serving as a transmitter and the connector 310 is installed in a personal computer, an audio-visual device for DVDs or the like, or a household electric appliance, and a printed wiring board 100 including the integrated circuit element 300 serving as a receiver and the connector 310 is installed in a monitor, inserting the HDMI cable to the connectors 310 of the respective printed wiring boards 100 enables digital differential signals representing images and sound to be transmitted from the personal computer or the like to the monitor.

The differential transmission paths 1 to 4 are provided between the integrated circuit element 300 and the connector 310 and used for transmitting differential signals. The differential transmission path 1 is used for transmitting a clock signal T.M.D.S.Clock, and the differential transmission paths 2 to 4 are used for transmitting differential signals T.M.D.S.Data0 to T.M.D.S.Data2 representing RGB images and sound.

As shown in FIG. 2, each of the differential transmission paths 1 to 4 includes a pair of signal lines. In other words, the differential transmission paths 1 to 4 include first signal lines 1a to 4a and second signal lines 1b to 4b, respectively. For example, the first signal line 1a transmits a differential signal T.M.D.S.Clock+, and the second signal line 1b transmits a differential signal T.M.D.S.Clock− whose phase is opposite to that of the differential signal T.M.D.S.Clock+. The first signal line 2a transmits a differential signal T.M.D.S.Data0+, and the second signal line 2b transmits a differential signal T.M.D.S.Data0− whose phase is opposite to that of the differential signal T.M.D.S.Data0+. The first and second signal lines 3a and 3b transmit a differential signal T.M.D.S.Data1+ and a differential signal T.M.D.S.Data1−, respectively. The first and second signal lines 4a and 4b transmit a differential signal T.M.D.S.Data2+ and a differential signal T.M.D.S.Data 2−, respectively.

When the differential transmission paths 1 to 4 are installed, ends of the differential transmission paths 1 to 4 are connected to terminals of the integrated circuit element 300 and terminals of the connector 310.

Thus, the differential transmission paths 1 to 4 are arranged on the printed wiring board 100 such that ends of the first signal lines 1a to 4a and ends of the second signal lines 1b to 4b that define the differential transmission paths 1 to 4, respectively, are disposed at positions where the corresponding terminals of the integrated circuit element 300 are disposed and positions where the corresponding terminals of the connector 310 are disposed.

More specifically, as shown in FIG. 3, first ends (an upper side in FIG. 3) of the first signal lines 1a to 4a of the differential transmission paths 1 to 4 are disposed at positions encircled by broken lines, that is, positions where terminals 301a to 304a, which are the corresponding terminals of the integrated circuit element 300, are disposed, respectively. The second ends (a lower side in FIG. 3) of the first signal lines 1a to 4a of the differential transmission paths 1 to 4 are disposed at positions encircled by broken lines, that is, positions where terminals 311a to 314a, which are the corresponding terminals of the connector 310, are disposed, respectively. Similarly, first ends of the second signal lines 1b to 4b are disposed at positions where terminals 301b to 304b, which are the corresponding terminals of the integrated circuit element 300, are disposed, respectively. The second ends of the second signal lines 1b to 4b are disposed at positions where terminals 311b to 314b, which are the corresponding terminals of the connector 310, are disposed, respectively.

Each of the first signal lines 1a to 4a and each of the second signal lines 1b to 4b are substantially hook-shaped as a whole. The first signal lines 1a to 4a and the second signal lines 1b to 4b are arranged substantially parallel to each other and have substantially the same length.

In other words, each of the first signal lines 1a to 4a includes a substantially straight first line element 11a, a substantially straight second line element 12a, and a substantially straight third line element 13a. The first line elements 11a start from the first ends located at the positions where the terminals 301a to 304a of the integrated circuit element 300 are disposed and extend toward the connector 310. The second line elements 12a are connected to the first line elements 11a and tilted at about 90 degrees with respect to the first line elements 11a. First ends of the third line elements 13a are connected to second ends of the second line elements 12a and the second ends of the third line elements 13a are located at the positions where the terminals 311a to 314a of the connector 310 are disposed.

Each of the second signal lines 1b to 4b includes a substantially straight first line element 11b, a substantially straight second line element 12b, and a substantially straight third line element 13b, almost similarly to the first signal lines 1a to 4a. The first line elements 11b start from the positions where the terminals 301b to 304b of the integrated circuit element 300 are disposed and extend toward the connector 310. The second line elements 12b are connected to the first line elements 11b and tilted at about 90 degrees with respect to the first line elements 11b. First ends of the third line elements 13b are connected to second ends of the second line elements 12b and the second ends of the third line elements 13b are located at the positions where the terminals 311b to 314b of the connector 310 are disposed.

As described above, the lengths of the first signal lines 1a to 4a are equal to the lengths of the second signal lines 1b to 4b, and the first signal lines 1a to 4a and the second signal lines 1b to 4b are substantially parallel to each other and have substantially the same shape. However, the lengths of the first line elements 11b and the third line elements 13b of the second signal lines 1b to 4b are different from the lengths of the first line elements 11a and the third line elements 13a of the first signal lines 1a to 4a, respectively.

Figure 4:
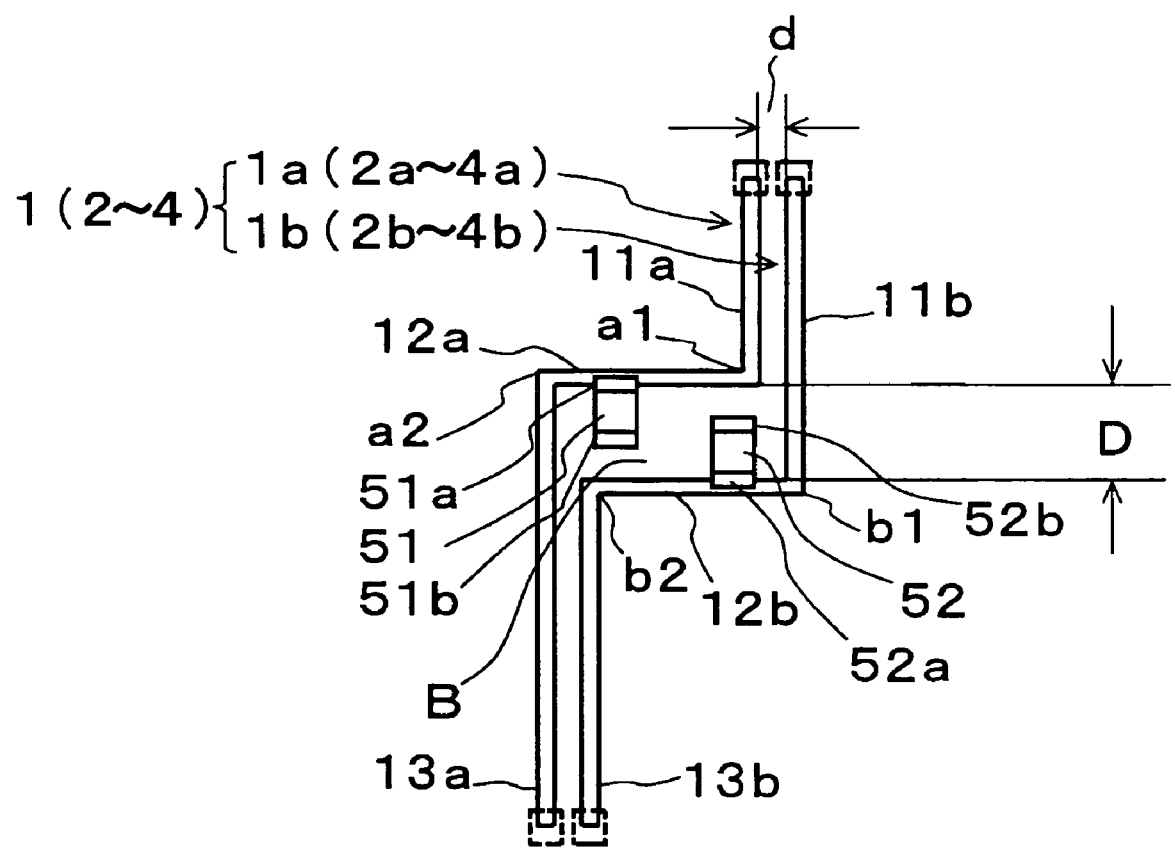
FIG. 4 is a magnified view for explaining the relationship between a first signal line and a second signal line.

FIG. 4 is a magnified view for explaining the relationship between the first signal line 1a, 2a, 3a, or 4a and the second signal line 1b, 2b, 3b, or 4b.

As shown in FIG. 4, the length of the second line element 12a of each of the first signal lines 1a to 4a is substantially equal to the length of the second line element 12b of each of the second signal lines 1b to 4b. In contrast, the first line element 11b is longer than the first line element 11a by a distance between the second line elements 12a and 12b, and the third line element 13b is shorter than the third line element 13a by the distance D between the second line elements 12a and 12b. Thus, a substantially rectangular area B defined by the second line elements 12a and 12b, which function as longer sides thereof, is formed between each of the first signal lines 1a to 4a and each of the second signal lines 1b to 4b, and first and second electrostatic protection elements 51 and 52 are disposed within the area B.

The first electrostatic protection element 51 and the second electrostatic protection element 52 protect each of the first signal lines 1a to 4a and each of the second signal lines 1b to 4b, respectively, from surge voltages. In this preferred embodiment, varistors having the same characteristics are used as the first and second electrostatic protection elements 51 and 52.

The first electrostatic protection element 51 and the second electrostatic protection element 52 are connected in the middle of each of the first signal lines 1a to 4a and each of the second signal lines 1b to 4b, respectively.

More specifically, the first electrostatic protection element 51 and the second electrostatic protection element 52 are disposed within the area B, and a first terminal 51a and a first terminal 52a are connected to the second line element 12a and the second line element 12b of each of the first signal lines 1a to 4a and each of the second signal lines 1b to 4b, respectively. In addition, the positions of connection points of the first electrostatic protection element 51 and the second electrostatic protection element 52 in the second signal lines 12a and 12b are set such that line lengths to the connection points are equal to each other. In other words, as shown in FIG. 4, the line length to the connection point of the first electrostatic protection element 51 in each of the first signal lines 1a to 4a is equal to a sum La obtained by adding the line length of the first line element 11a to the line length from a joint portion a1 of the second line element 12a to the connection point of the first electrostatic protection element 51. The line length to the connection point of the second electrostatic protection element 52 in each of the second signal lines 1b to 4b is equal to a sum Lb obtained by adding the line length of the first line element 11b to the line length from a joint portion b1 of the second line element 12b to the connection point of the second electrostatic protection element 52. Accordingly, the connection points of the first and second electrostatic protection elements 51 and 52 are set such that the sum La is equal to the sum Lb.

In addition, when the first terminal 51a and the first terminal 52a of the first electrostatic protection element 51 and the second electrostatic protection element 52 are connected to the second line element 12a and the second line element 12b, a line passing through the first terminal 51a to the second terminal 51b and a line passing through the first terminal 52a to the second terminal 52b are substantially perpendicular to the second line element 12a and the second line element 12b, respectively. The second terminals 51b and 52b are connected to a ground 101 provided on the rear surface of the printed wiring board 100.

Figure 5:
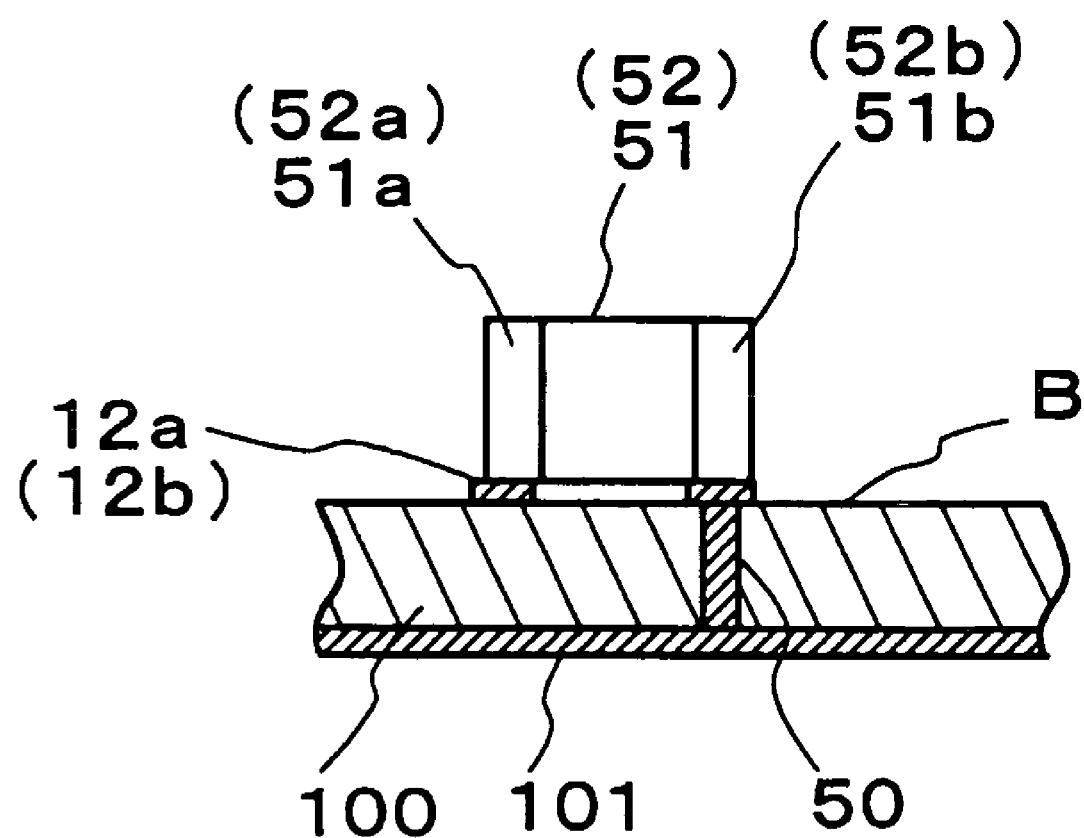
FIG. 5 is a magnified cross-sectional view showing a connection state of first and second electrostatic protection elements and a ground.

FIG. 5 is a magnified cross-sectional view showing a connection state of the first electrostatic protection element 51 or the second electrostatic protection element 52 and the ground 101.

As shown in FIG. 5, a through hole 50 is provided in the printed wiring board 100 and is connected to the ground 101 on the rear surface of the printed wiring board 100. Each of the second terminals 51b and 52b of the first and second electrostatic protection elements 51 and 52 is disposed above a through hole 50 and connected to the through hole 50.

The characteristic impedances of the differential transmission paths 1 to 4 defined by the first signal lines 1a to 4a and the second signal lines 1b to 4b, respectively, are set as shown in FIG. 4.

In other words, the characteristic impedances of the differential transmission paths 1 to 4 based on the HDMI standard must be in a range between about 85 Ω and about 115 Ω. Normally, the characteristic impedances are set to about 100 Ω. More specifically, taking into consideration line-to-line coupling between the first signal lines 1a to 4a and the second signal lines 1b to 4b, each signal line is set to exhibit an impedance of about 60 Ω so that the characteristic impedances of the respective whole differential transmission paths 1 to 4 during operation are about 100 Ω. Thus, the characteristic impedances between the first line elements 11a and 11b and between the third line elements 13a and 13b are set to about 100 Ω. However, as described above, since the first and second electrostatic protection elements 51 and 52 are connected in the middle of each of the first signal lines 1a to 4a and each of the second signal lines 1b to 4b, respectively, the characteristic impedance between the second line elements 12a and 12b may be reduced to below the standard range between about 85 Ω and about 115 Ω due to the capacitance of the first and second electrostatic protection elements 51 and 52. In the first preferred embodiment, a distance D between the second line elements 12a and 12b is larger than a distance d between the first line elements 11a and 11b and between the third line elements 13a and 13b so that line-to-line coupling based on the first and second electrostatic protection elements 51 and 52 is reduced. Thus, a substantially uniform characteristic impedance is achieved over the entire length of each of the differential transmission paths 1 to 4 including the second line elements 12a and 12b. The distance D between the second line elements 12a and 12b is determined in an appropriate fashion by taking into consideration the amount of reduction of the characteristic impedance due to the first and second electrostatic protection elements 51 and 52. Normally, however, the distance D between the second line elements 12a and 12b can be determined based on simulations or the like.

The positional relationship between the substantially rectangular areas B formed in the differential transmission paths 1 to 4 is described next.

As shown in FIG. 3, the four areas B of the differential transmission paths 1 to 4 are arranged adjacent to each other in the downward direction of the drawing.

Figure 6:
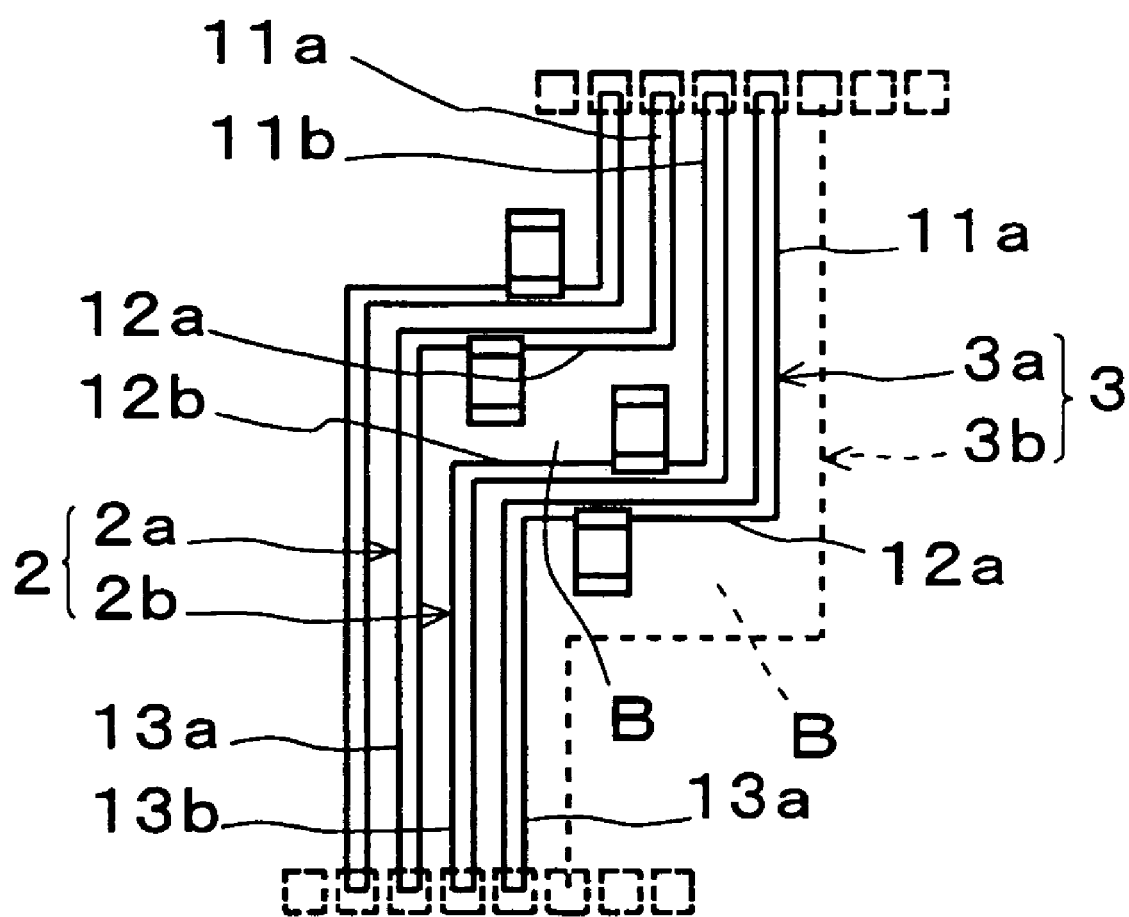
FIG. 6 is a plan view for explaining the relationship between adjacent differential transmission paths.

FIG. 6 is a plan view for explaining the relationship between adjacent differential transmission paths.

As shown in FIG. 6, for example, for the differential transmission paths 2 and 3 that are adjacent to each other, the first line element 11a of the first signal line 3a of the differential transmission path 3 is set to be slightly longer than the first line element 11b of the second signal line 2b of the differential transmission path 2. The third line element 13a of the first signal line 3a of the differential transmission path 3 is set to be shorter than the third line element 13b of the second signal line 2b of the differential transmission path 2 by the amount of increase in the length of the first line element 11a. Thus, the second line element 12a of the first signal line 3a of the differential transmission path 3 can be close and substantially parallel to the second line element 12b of the second signal line 2b of the differential transmission path 2. As a result, the area B of the differential transmission path 2 and the area B of the differential transmission path 3 can be arranged so as to be close to each other. For the differential transmission paths 1 and 2 that are adjacent to each other and for the differential transmission paths 3 and 4 that are adjacent to each other, the areas B can also be close to each other.

Operations and advantages of the wiring pattern structure of the differential transmission paths according to the first preferred embodiment will now be described.

Two printed wiring boards 100 on which the wiring patterns of the differential transmission paths 1 to 4 shown in FIG. 3 are provided are prepared. The integrated circuit element 300 functioning as a transmitter and the connector 310 are installed on one printed wiring board 100 as shown in FIGS. 1 and 2, and the printed wiring board 100 is installed in a computer or the like. The integrated circuit element 300 functioning as a receiver and the connector 310 are installed on another printed wiring board 100, and the other printed wiring board 100 is installed in a monitor.

As shown in FIG. 3, the four substantially rectangular areas B of the differential transmission paths 1 to 4 formed on the printed wiring board 100 are close to each other and arranged in the vertical direction, and the sizes of the differential transmission paths 1 to 4 are reduced in the vertical and horizontal directions. In other words, as shown in FIGS. 1 and 2, the differential transmission paths 1 to 4 are accommodated within a small area between the integrated circuit element 300 and the connector 310, and the size of the patterns of the differential transmission paths 1 to 4 are extremely reduced. Thus, the size of the printed wiring board 100 itself is reduced, so that the printed wiring board 100 can be easily installed in a compact personal computer or monitor.

In addition, since the first and second electrostatic protection elements 51 and 52 are disposed within the substantially rectangular area B so as to be shifted in the width direction of the first and second electrostatic protection elements 51 and 52 (in the horizontal direction of the drawing), the distance between the second line elements 12a and 12b can be freely set. As a result, the distance between the second line elements 12a and 12b is reduced, and the area B is thus reduced. Accordingly, a patterning area is further reduced. Thus, the printed wiring board 100 can be installed in a more compact personal computer or monitor.

After installing the printed wiring boards 100 in the personal computer and the monitor, an HMDI cable is connected to the connectors 310 of the respective printed wiring boards 100, and transmission of differential signals are performed. Differential signals T.M.D.S.Clock+ and T.M.D.S.Clock− from the integrated circuit element 300 of the printed wiring board 100 in the personal computer are output to the first and second signal lines 1a and 1b, and differential signals T.M.D.S.Data0+, T.M.D.S.Data0−, T.M.D.S.Data1+, T.M.D.S.Data1−, T.M.D.S.Data2+, and T.M.D.S.Data2− are output to the first and second signal lines 2a, 2b, 3a, 3b, 4a, and 4b, respectively. These differential signals are transmitted via the differential transmission paths 1 to 4.

The differential transmission paths 1 and 4, which are located at outer sides, do not extend in the horizontal direction, and the lengths of all the differential transmission paths 1 to 4 are equal to each other. In other words, the differential transmission paths 1 to 4 are wired with the same length, and all the differential signals synchronously reach the connector 310 without delay.

In addition, since a substantially uniform characteristic impedance is achieved over the entire length of the differential transmission paths 1 to 4 including the first signal lines 1a to 4a and the second signal lines 1b to 4b, respectively, reflection of the differential signals hardly occurs in the differential transmission paths 1 to 4, thus achieving transmission with high quality characteristics.

As shown in FIG. 5, the through holes 50 for the first and second electrostatic protection elements 51 and 52 are formed in the area B of each of the differential transmission paths 1 to 4. If the through hole 50 is arranged near the second line element 12a or the second line element 12b and there are manufacturing variations, the through hole 50 may have a bad effect on the second line element 12a or the second line element 12b and may deteriorate the line characteristics. However, in the first preferred embodiment, since lines passing through the first terminals 51a and 52a to the second terminals 51b and 52b are substantially perpendicular to the second line elements 12a and 12b, the through hole 50 is most distant from the second line elements 12a and 12b. Thus, variations of the through hole 50 do not have a bad effect on the second line elements 12a and 12b.

Then, the differential signals received by the connector 310 are input to the connector 310 of the printed wiring board 100 in the monitor via the HDMI cable, and received by the integrated circuit element 300 functioning as a receiver via the differential transmission paths 1 to 4. The differential transmission paths 1 to 4 of the printed wiring board 100 installed in the monitor also exhibit high transmission characteristics, similarly to the differential transmission paths 1 to 4 of the printed wiring board 100 installed in the personal computer.

Second Preferred Embodiment

A second preferred embodiment of the present invention will now be described.

Figure 7:
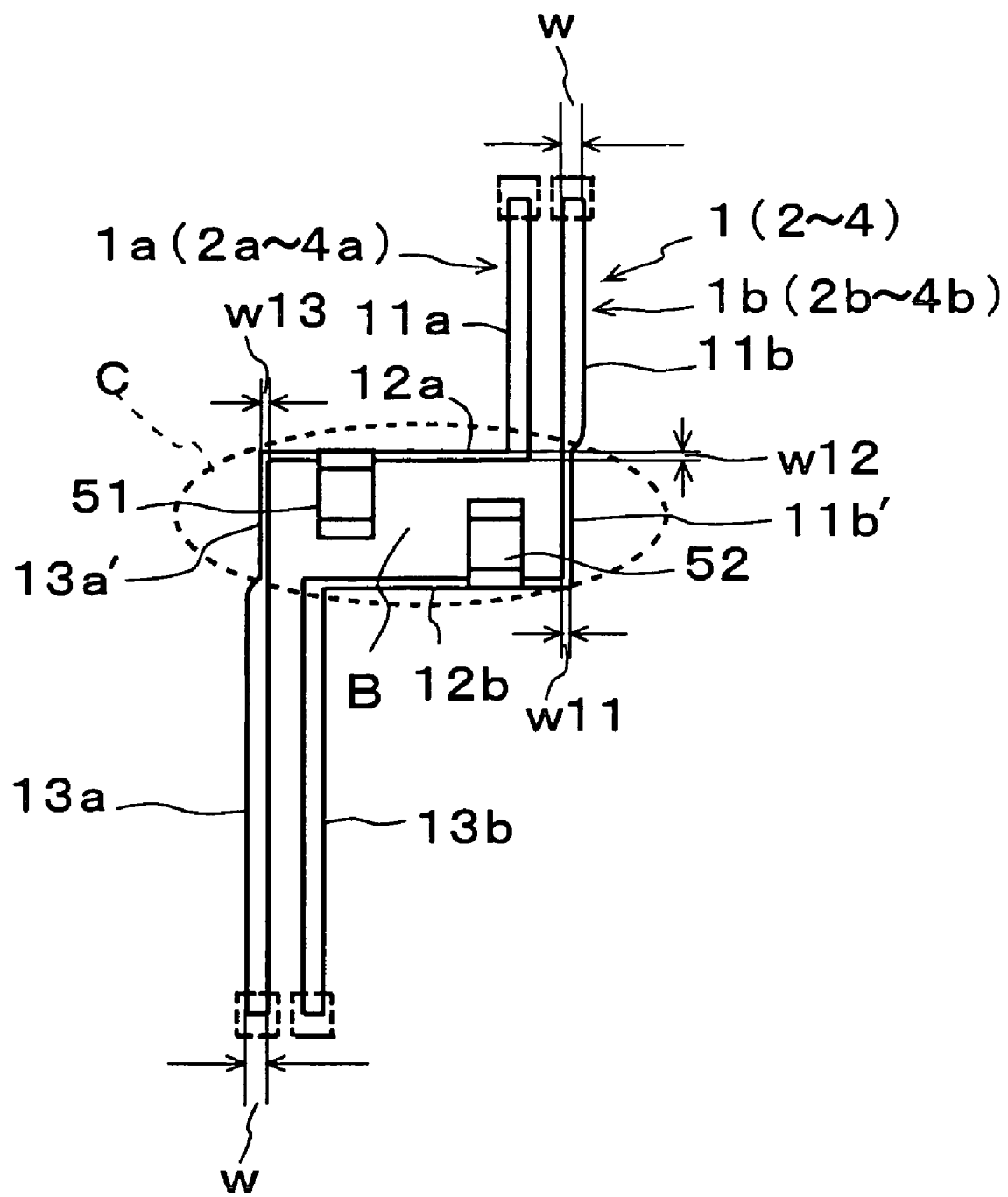
FIG. 7 is a magnified plan view showing a principal portion of a wiring pattern structure of differential transmission paths according to a second preferred embodiment of the present invention.

FIG. 7 is a magnified plan view showing a principal portion of the wiring pattern structure of differential transmission paths according to the second preferred embodiment of the present invention.

The wiring pattern structure of the differential transmission paths according to the second preferred embodiment is different from the wiring pattern structure of the differential transmission paths according to the first preferred embodiment in that the line widths of portions defining the areas B of the first signal lines 1a to 4a and the second signal lines 1b to 4b of the differential transmission paths 1 to 4 are smaller than the line widths of the other portions of the first signal lines 1a to 4a and the second signal lines 1b to 4b of the differential transmission paths 1 to 4.

By setting the line widths of the portions defining the substantially parallelogram-shaped areas of the first and second signal lines of the differential transmission paths to be smaller than the line widths of the other portions of the first and second signal lines of the differential transmission paths in order to increase the inductance of the portions defining the areas, a substantially uniform characteristic impedance can be achieved over the entire length of the respective differential transmission paths.

As shown in FIG. 4, in the first preferred embodiment, the first line elements 11a and 11b, the second line elements 12a and 12b, and the third line elements 13a and 13b preferably have the same line width. In addition, in the first preferred embodiment, in order to compensate for a reduction in the characteristic impedance due to connection of the first and second electrostatic protection elements 51 and 52, the distance D between the second line elements 12a and 12b is preferably larger than the distance d between the first line elements 11a and 11b and between the third line elements 13a and 13b, thus increasing the characteristic impedance between the second line elements 12a and 12b. However, depending on the capacitance of the first and second electrostatic protection elements 51 and 52, a desired characteristic impedance may not be achieved even if the distance D between the second line elements 12a and 12b increases. In addition, due to restrictions of a patterning area, the distance D between the second line elements 12a and 12b may be under certain restrictions.

The second preferred embodiment is especially effective for such a case.

In other words, as encircled by the broken line C in FIG. 7, the area B is defined by the second line elements 12a and 12b, a portion 13a' of the third line element 13a and a portion 11b' of the first line element 11b. The line widths w12 of the second line elements 12a and 12b, the line width w13 of the portion 13a' of the third line element 13a, and the line width w11 of the portion 11b' of the first line element 11b are preferably smaller than the line widths w of the other portions in order to increase the inductance of the second line elements 12a and 12b, the portion 13a' of the third line element 13a, and the portion 11b' of the first line element 11b. Thus, a certain amount of characteristic impedance that cannot be achieved by the increase in the distance D between the second line elements 12a and 12b can be ensured, and a substantially uniform characteristic impedance can be achieved over the entire length of the respective differential transmission paths 1 to 4. As a result, a wiring pattern structure of the differential transmission paths 1 to 4 in which reflection of differential signals hardly occurs can be achieved. The line widths w11, w12, and w13 are determined in an appropriate manner by taking into consideration the amount of reduction in the characteristic impedance due to the first and second electrostatic protection elements 51 and 52 and the amount of increase in the characteristic impedance due to the distance D between the second line elements 12a and 12b. Normally, however, the line widths w11, w12, and w13 may be determined based on simulations or the like.

Since other structures, operations, and advantages of the second preferred embodiment are similar to those of the first preferred embodiment, descriptions of the other structure, operations, and advantages of the second preferred embodiment are omitted here.

Third Preferred Embodiment

A third preferred embodiment of the present invention will now be described.

Figure 8:
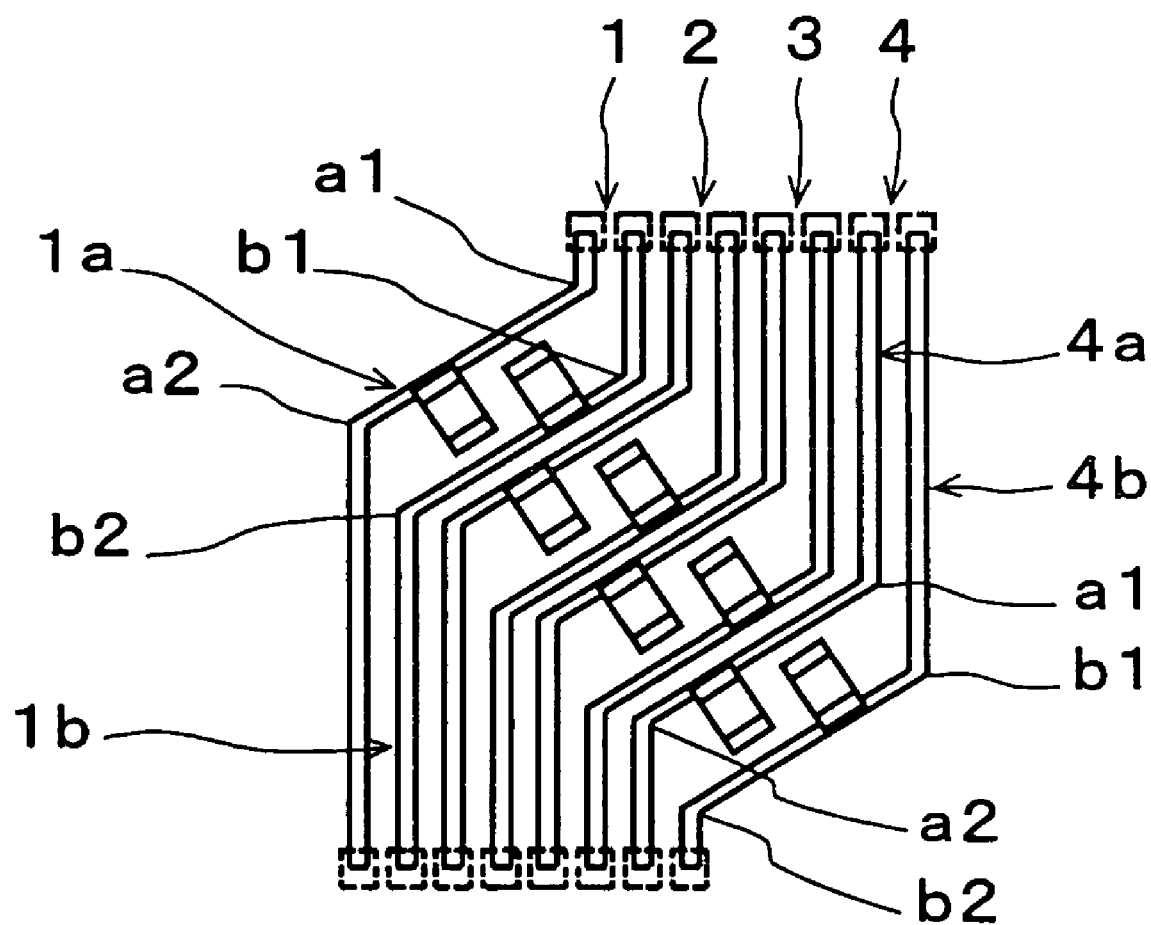
FIG. 8 is a magnified plan view showing a principal portion of a wiring pattern structure of differential transmission paths according to a third preferred embodiment of the present invention.

FIG. 8 is a magnified plan view showing a principal portion of a wiring pattern structure of differential transmission paths according to the third preferred embodiment of the present invention.

The wiring pattern structure of the differential transmission paths according to the third preferred embodiment is different from the wiring pattern structures of the differential transmission paths according to the first and second preferred embodiments in that the areas B are substantially parallelogram-shaped, instead of being substantially rectangular shaped.

More specifically, as shown in FIG. 8, angles of joint portions a1 and a2 of the first signal lines 1a to 4a and joint portions b1 and b2 of the second signal lines 1b to 4b of the differential transmission paths 1 to 4 are obtuse, such as about 120 degrees, instead of being right angles.

With this structure, reflection of differential signals in the joint portions a1 and a2 and the joint portions b1 and b2 is reduced. Thus, the transmission characteristics can be further improved.

Since other structures, operations, and advantages of the third preferred embodiment are similar to those of the first and second preferred embodiments, descriptions of the other structures, operations, and advantages of the third preferred embodiment are omitted here.

Fourth Preferred Embodiment

A fourth preferred embodiment of the present invention will now be described.

Figure 9:
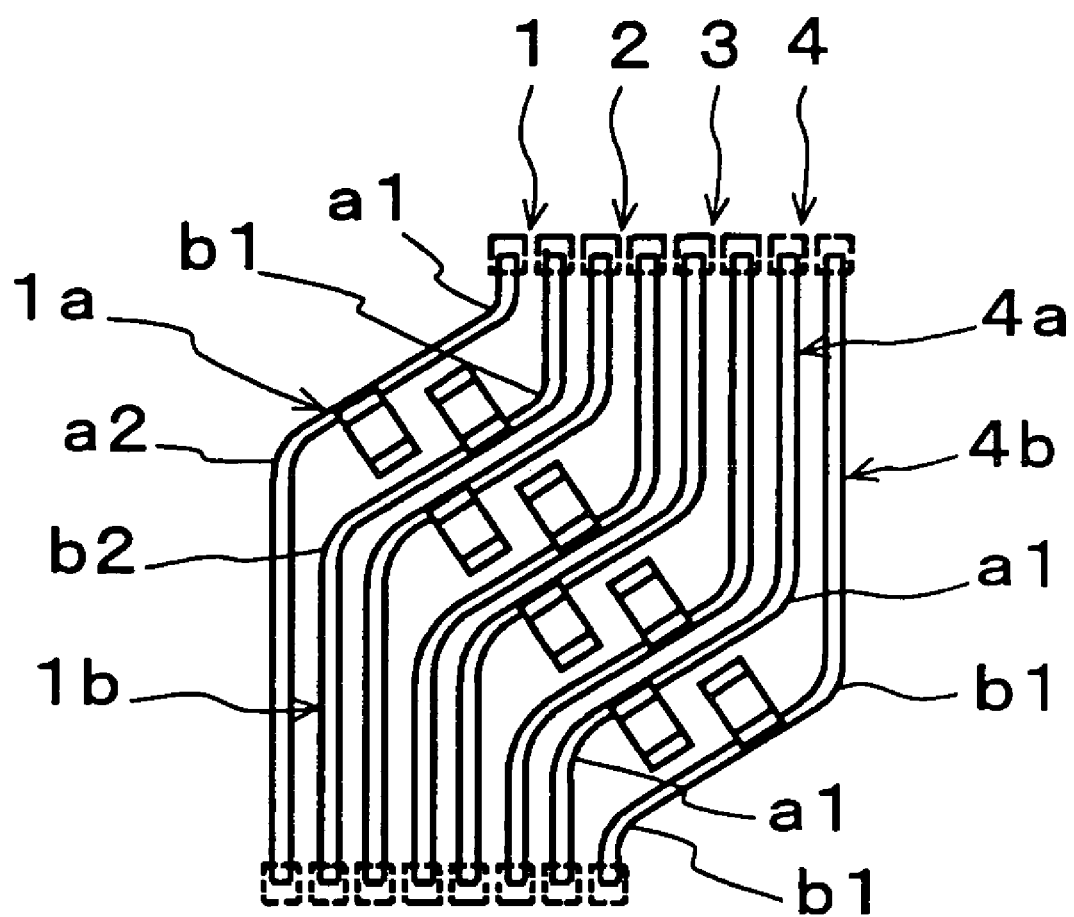
FIG. 9 is a magnified plan view showing a principal portion of a wiring pattern structure of differential transmission paths according to a fourth preferred embodiment of the present invention.

FIG. 9 is a magnified plan view showing a principal portion of a wiring pattern structure of differential transmission paths according to the fourth preferred embodiment of the present invention.

The wiring pattern structure of the differential transmission paths according to the fourth preferred embodiment is different from the wiring pattern structure of the differential transmission paths according to the third preferred embodiment in that joint portions of respective signal lines are rounded.

In other words, as shown in FIG. 9, the joint portions a1 and a2 of the first signal lines 1a to 4a and the joint portions b1 and b2 of the second signal lines 1b to 4b of the differential transmission paths 1 to 4 are rounded, instead of forming a certain angle.

With this structure, reflection of differential signals in the joint portions a1 and a2 and the joint portions b1 and b2 can be further reduced. Thus, the transmission characteristics can be further improved.

Since other structures, operations, and advantages of the fourth preferred embodiment are similar to those of the third preferred embodiment, descriptions of the other structures, operations, and advantages of the fourth preferred embodiment are omitted here.

The present invention is not limited to the foregoing preferred embodiments. Various changes and modifications can be made to the present invention without departing from the scope and the spirit thereof.

For example, although the line length La from the first end of each of the first signal lines 1a to 4a to the first electrostatic protection element 51 and the line length Lb from the first end of each of the second signal lines 1b to 4b to the second electrostatic protection element 52 are equal to each other in the foregoing preferred embodiments, a wiring pattern structure in which the line lengths La and Lb are not equal to each other is not excluded from the scope of the present invention.

In addition, although the first and second electrostatic protection elements 51 and 52 are connected substantially perpendicularly to the second line elements 12a and 12b in the foregoing preferred embodiments, a wiring pattern structure in which the first and second electrostatic protection elements 51 and 52 are connected to the second line elements 12a and 12b at an angle other than a right angle is not excluded from the scope of the present invention.

In addition, although varistors are preferably used as the first and second electrostatic protection elements 51 and 52 in the foregoing preferred embodiments, the electrostatic protection elements 51 and 52 are not necessarily varistors. Any elements capable of preventing surge voltages, such as Zener diodes or other devices, may be used as the first and second electrostatic protection elements 51 and 52.

In addition, although a differential transmission path based on the DVI standard or the HDMI standard is explained as an example in the foregoing preferred embodiments, the present invention is also applicable to a high-speed differential transmission path based on a standard other than the DVI standard or the HDMI standard.

In addition, although the joint portions a1 and a2 of the first signal lines 1a to 4a and the joint portions b1 and b2 of the second signal lines 1b to 4b of the differential transmission paths 1 to 4 defining the substantially parallelogram-shaped areas B are preferably rounded in the fourth preferred embodiment, it is obvious that the joint portions a1 and a2 of the first signal lines 1a to 4a and the joint portions b1 and b2 of the second signal lines 1b to 4b of the differential transmission paths 1 to 4 forming the substantially rectangular areas B as in the first preferred embodiment may be rounded.

Figure 10:
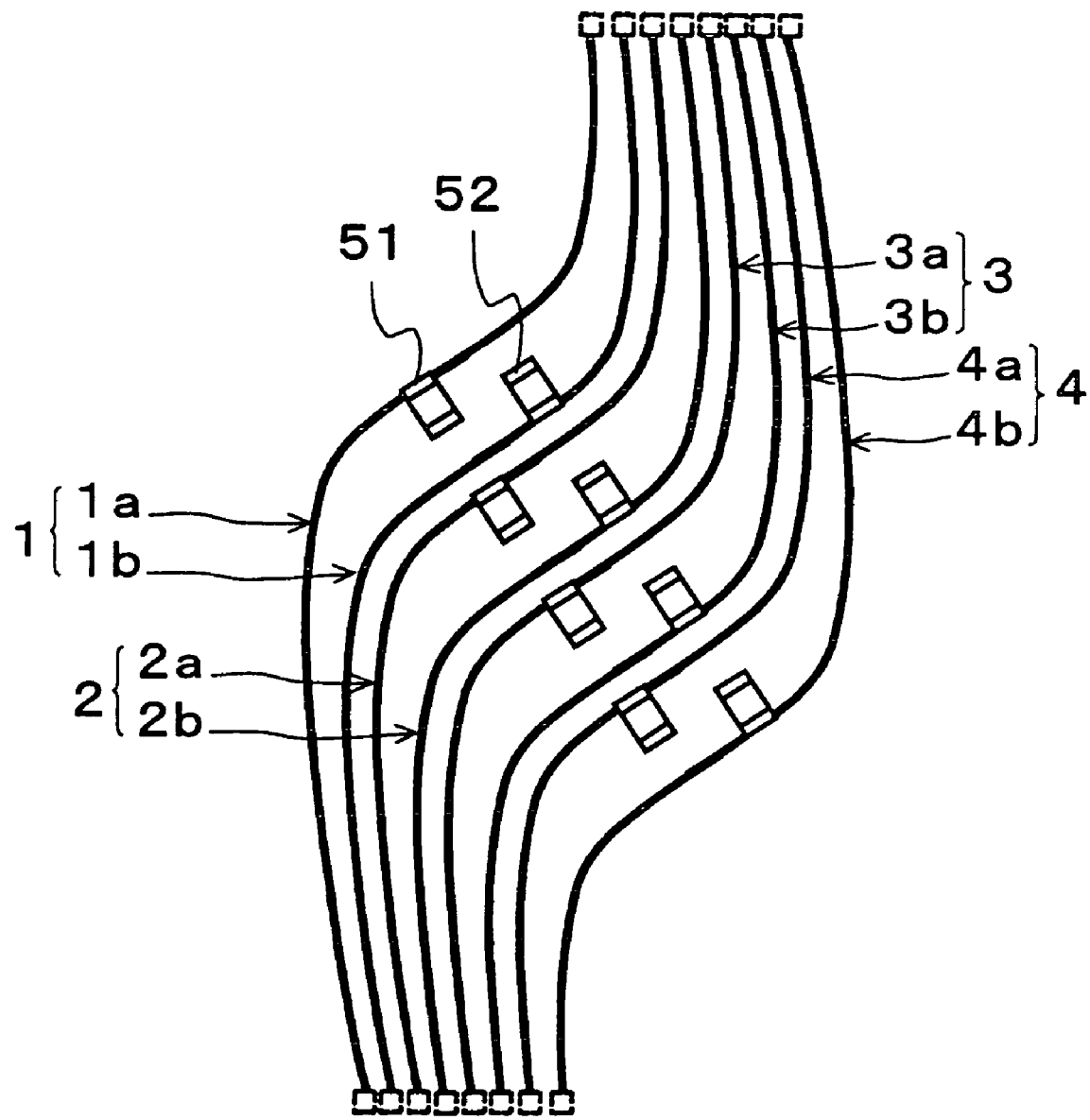
FIG. 10 is a magnified plan view showing a principal portion of a wiring pattern structure of differential transmission paths according to a modification.

In addition, although the first signal lines 1a to 4a and the second signal lines 1b to 4b of the differential transmission paths 1 to 4 include the substantially straight first line elements 11a and 11b, the substantially straight second line elements 12a and 12b, and the substantially straight third line elements 13a and 13b in the foregoing preferred embodiments, the first signal lines 1a to 4a and the second signal lines 1b to 4b are not necessarily straight. For example, as shown in FIG. 10, the present invention is also applicable to a case where the entire shape of the first signal lines 1a to 4a and the entire shape of the second signal lines 1b to 4b are curved or a case where a portion of the shape of the first signal lines 1a to 4a and a portion of the shape of the second signal lines 1b to 4b are curved.

While preferred embodiments of the present invention have been described above, it is to be understood that variations and modifications will be apparent to those skilled in the art without departing the scope and spirit of the invention. The scope of the invention, therefore, is to be determined solely by the following claims.

What is claimed is:

1. A wiring pattern structure comprising:
   first and second electronic components arranged to send and receive differential signals, the first and second electronic components provided on a front surface of a board, and the first and second electronic components each having terminals;
   differential transmission paths each including a pair of first and second signal lines, each end of the first and second signal lines arranged at positions where corresponding terminals of the first and second electronic components are located so that the first and second electronic components are capable of being electrically connected to each other; and
   first and second electrostatic protection elements each having a first terminal and a second terminal, the first terminal of the first electrostatic protection element is connected to the first signal line and the first terminal of the second electrostatic protection element is connected to the second signal line; wherein
   the first and second electrostatic protection elements are disposed in an area between the first and second signal lines; and
   the first and second electrostatic protection elements are shifted in the width direction of the first and second electrostatic protection elements so as to partially overlap each other when viewed from the width direction.

2. The wiring pattern structure according to claim 1, wherein the first and second signal lines of each of the differential transmission paths are substantially parallel to each other and have substantially the same length.

3. The wiring pattern structure according to claim 1, wherein the first and second electrostatic protection elements are varistors.

4. The wiring pattern structure according to claim 1, wherein the differential transmission paths are high-speed differential transmission paths based on the DVI standard or the HDMI standard.

5. The wiring pattern structure according to claim 1, wherein the first electronic component is an integrated circuit element having at least one of a transmission function and a reception function for the differential signals, and the second electronic component is a connector.

6. The wiring pattern structure according to claim 1, wherein the first and second signal lines of each of the differential transmission paths are curved.

7. The wiring pattern structure according to claim 1, wherein each of the first and second signal lines of each of the differential transmission paths includes a substantially straight first line element arranged to extend from a position where the corresponding terminal of the first electronic component is located, a substantially straight second line element that is connected to the first line element and that is tilted at a predetermined angle with respect to the first line element, and a substantially straight third line element that is connected to the second line element and arranged to extend toward a position where the corresponding terminal of the second electronic component is located.

8. The wiring pattern structure according to claim 7, wherein the first line element of the first signal line of a first differential transmission path is longer than the first line element of the second signal line of a second differential transmission path, and the third line element of the first signal line of the first differential transmission path is shorter than the third line element of the second signal line of the second differential transmission path, and the second line element of the first signal line of the first differential transmission path is substantially adjacent and parallel to the second line element of the second signal line of the second differential transmission path.

9. The wiring pattern structure according to claim 7, wherein a distance between the second line element of the first signal line and the second line element of the second signal line of each of the differential transmission paths is larger than a distance between the first line element of the first signal line and the first line element of the second signal line of each of the differential transmission paths and larger than a distance between the third line element of the first signal line and the third line element of the second signal line of each of the differential transmission paths in order to reduce line-to-line coupling so that each of the differential transmission paths exhibits a substantially uniform characteristic impedance over the entire length of each of the differential transmission paths.

10. The wiring pattern structure according to claim 7, wherein the second electrostatic protection element is connected to a point in the second line element of the second signal line such that a line length from a connection point of the first electrostatic protection element to a first end of the first signal line is substantially equal to a line length from a connection point of the second electrostatic protection element to a first end of the second signal line.

11. The wiring pattern structure according to claim 7, wherein a joint portion between the first line element and the second line element and a joint portion between the second line element and the third line element of each of the first and second signal lines are rounded.

12. The wiring pattern structure according to claim 7, wherein the predetermined angle between the substantially straight second line element and the first line element is obtuse.

13. The wiring pattern structure according to claim 7, wherein the first terminals of the first and second electrostatic protection elements are connected to the second line elements of the first and second signal lines such that lines passing through the first and second terminals of the first and second electrostatic protection elements, respectively, are substantially perpendicular to the second line elements of the first and second signal lines, and the second terminals are connected to through holes that penetrate portions of the board where the second terminals are located and are connected to a ground provided on a rear surface of the board.

14. The wiring pattern structure according to claim 7, wherein the second line element of the first signal line and the second line element of the second signal line have substantially the same length, the area between the first and second signal lines forming a substantially parallelogram shape, and the first terminal of the first electrostatic protection element is connected to the second line element of the first signal line and the first terminal of the second electrostatic protection element is connected to the second line element of the second signal line.

15. The wiring pattern structure according to claim 14, wherein line widths of portions of the first and second signal lines of each of the differential transmission paths that define the area of the substantially parallelogram shape are smaller than line widths of other portions of the first and second signal lines in order to increase an inductance of the portions of the first and second signal lines that define the area so that each of the differential transmission paths exhibits a substantially uniform characteristic impedance over the entire length of each of the differential transmission paths.

16. The wiring pattern structure according to claim 14, wherein the area of the substantially parallelogram shape defined by the second line elements of the first and second signal lines is substantially rectangular shaped.

17. The wiring pattern structure according to claim 14, wherein the area of the substantially parallelogram shape defined by the second line elements of the first and second signal lines is not rectangular shaped.

18. A wiring pattern structure comprising:
    first and second electronic components arranged to send and receive differential signals, the first and second electronic components provided on a front surface of a board, and the first and second electronic components each having terminals;
    differential transmission paths each including a pair of first and second signal lines, each end of the first and second signal lines arranged at positions where corresponding terminals of the first and second electronic components are located so that the first and second electronic components are capable of being electrically connected to each other; and
    first and second electrostatic protection elements each having a first terminal and a second terminal on opposing ends of the electrostatic protection element, a distance between the opposing ends of an electrostatic protection element defining a length thereof, the first terminal of the first electrostatic protection element is connected to the first signal line and the first terminal of the second electrostatic protection element is connected to the second signal line; wherein
    the first and second electrostatic protection elements are disposed in an area between the first and second signal lines; and
    a distance between the first and second signal lines in the area where the first and second electrostatic elements are disposed and at a location where the first terminal of the first electrostatic protection element is connected to the first signal line and the first terminal of the second electrostatic protection element is connected to the second signal line, is less than a sum of the lengths of the first and second electrostatic protection elements.

19. The wiring pattern structure according to claim 18, wherein a first longitudinal side extending from the first terminal to the second terminal of the first electrostatic element faces and partially overlaps a first longitudinal side extending from the first terminal to the second terminal of the second electrostatic protection element.

20. The wiring pattern structure according to claim 18, wherein the first and second electrostatic protection elements are varistors, and the differential transmission paths are high-speed differential transmission paths based on the DVI standard or the HDMI standard.

* * * * *